United States Patent
Jiang et al.

(10) Patent No.: US 7,187,080 B2
(45) Date of Patent: Mar. 6, 2007

(54) SEMICONDUCTOR DEVICE WITH A CONDUCTIVE LAYER INCLUDING A COPPER LAYER WITH A DOPANT

(75) Inventors: Qing-Tang Jiang, Austin, TX (US); Changming Jin, Plano, TX (US); Joseph D. Luttmer, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/964,963

(22) Filed: Oct. 14, 2004

(65) Prior Publication Data

US 2005/0048784 A1  Mar. 3, 2005

Related U.S. Application Data

(62) Division of application No. 10/340,932, filed on Jan. 13, 2003, now Pat. No. 6,911,394.

(60) Provisional application No. 60/358,698, filed on Feb. 25, 2002.

(51) Int. Cl.
*H01L 23/48* (2006.01)

(52) U.S. Cl. ............ 257/751; 257/767; 257/774; 257/E23.16

(58) Field of Classification Search ........ 257/751, 257/767, 774, E23.16; 438/627, 643, 653, 438/927
See application file for complete search history.

(56) References Cited

U.S. PATENT DOCUMENTS

| | | | |
|---|---|---|---|
| 4,965,655 A | * | 10/1990 | Grimmer et al. ............ 257/56 |
| 5,592,024 A | * | 1/1997 | Aoyama et al. ............ 257/751 |
| 5,747,360 A | * | 5/1998 | Nulman ....................... 438/648 |
| 5,913,147 A | | 6/1999 | Dubin et al. |

(Continued)

FOREIGN PATENT DOCUMENTS

EP   0 877 421 A2   11/1998

OTHER PUBLICATIONS

W.A. Lanford, et al. "Low-Temperature Passivation of Copper by Doping with Al or Mg" Thin Solid Films, vol. 262, No. ½, Jun. 15, 1995, pp. 234-241, Elsevier-Sequoia S.A., Lausanne, CH.

*Primary Examiner*—Eugene Lee
(74) *Attorney, Agent, or Firm*—W. James Brady; Frederick J. Telecky, Jr.

(57) ABSTRACT

A method of manufacturing a semiconductor device includes the steps of providing a semiconductor substrate (202), forming a dielectric layer (204) over the semiconductor substrate (202), and etching a trench or a via (206) in the dielectric layer (204) to expose a portion of the surface of the semiconductor substrate (202). The method also includes the step of forming a conductive layer (212, 220) within in the trench or the via (206). The method further includes the steps of polishing a portion of the conductive layer (220) and annealing the conductive layer (212, 220) at a predetermined temperature. Moreover, the conductive layer (212, 220) also includes a dopant, and the dopant diffuses substantially to the surface of the top side of the conductive layer (212, 220) to form a dopant oxide layer (212a, 220a) when the conductive layer (212, 220) is annealed at the predetermined temperature and the dopant is exposed to oxygen.

2 Claims, 3 Drawing Sheets

U.S. PATENT DOCUMENTS

| | | | |
|---|---|---|---|
| 6,022,808 A * | 2/2000 | Nogami et al. | 438/694 |
| 6,057,223 A | 5/2000 | Lanford et al. | |
| 6,066,892 A * | 5/2000 | Ding et al. | 257/751 |
| 6,147,000 A * | 11/2000 | You et al. | 438/687 |
| 6,249,055 B1 * | 6/2001 | Dubin | 257/758 |
| 6,268,291 B1 | 7/2001 | Andricacos et al. | |
| 6,309,959 B1 | 10/2001 | Wang et al. | |
| 6,674,170 B1 * | 1/2004 | Ngo et al. | 257/774 |
| 6,717,266 B1 * | 4/2004 | Marathe et al. | 257/751 |
| 2004/0224507 A1 * | 11/2004 | Marieb et al. | 438/687 |

* cited by examiner

SEMICONDUCTOR DEVICE WITH A CONDUCTIVE LAYER INCLUDING A COPPER LAYER WITH A DOPANT

This is a division of application Ser. No. 10/340,932, filed Jan. 13, 2003, now U.S. Pat. No. 6,911,394 which claims benefit of provisional Application No. 60/358,698, filed Feb. 25, 2002.

BACKGROUND OF THE INVENTION

1. Field of the Invention

The present invention relates generally to the field of semiconductor devices. Specifically, the invention relates to semiconductor devices using copper interconnect lines, and methods of manufacturing such semiconductor devices.

2. Description of Related Art

Referring to FIGS. 1a–1e, a known method of manufacturing a known semiconductor device having copper interconnect lines includes the steps of forming a dielectric layer 104 over a semiconductor substrate 102, and etching a plurality of trenches or a plurality of vias 106, or both, into dielectric layer 104. Because copper atoms diffuse readily into other materials, e.g., dielectric materials, such known methods also include the step of forming a barrier layer 110 i.e., a metal barrier layer or a dielectric barrier layer, within trenches or vias 106. For example, known dielectric barrier layers may comprise SiN, SiC, SiCN, or similar dielectric compounds which, when used in a layer of sufficient thickness, substantially reduces or prevents the diffusion of copper atoms from one material to another material. Moreover, known metal barrier layers may comprise Ta, TaN, TiN, or similar metal compounds which, when used in a layer of sufficient thickness, substantially reduces or prevents the diffusion of copper atoms from one material to another material. This method also includes the steps of forming a pure copper seed layer 112 over barrier layer 110 and forming a pure copper plate layer 120 over pure copper seed layer 112. Moreover, a portion of copper seed layer 112, a portion of copper plate layer 120, and a portion of barrier layer 110 subsequently are removed by a known, chemical-mechanical polishing process, and an etch stop layer (not shown) may be formed over exposed copper plate layer 120. The etch stop layer may comprise SiN, SiC, SiCN, or similar dielectric compounds which, when used in a layer of sufficient thickness, substantially reduces or prevents the diffusion of copper atoms from one material to another material.

Nevertheless, many metal compounds have a polycrystalline structure through which atoms readily may diffuse. Consequently, impurities may be added to the known metal barriers in order to decrease the permeability of the metal compound. Although the impurities may allow the known metal barriers to substantially reduce or prevent the diffusion of copper atoms from one material to another material, the impurities increase the resistivity of the metal barrier layer. For example, the resistivity of the metal barrier layer may be ten times greater than the resistivity of the copper layers, which difference degrades the performance of the semiconductor device. With respect to dielectric barrier layers, the dielectric compounds used in known dielectric barrier layers may have an associated dielectric constant between 4.5 and 8.0, which degrades the performance of the semiconductor device. Moreover, the dielectric barrier layer is of a thickness suitable for substantially reducing or preventing copper atoms from diffusing from one material to another material, which further degrades the performance of the semiconductor device.

SUMMARY OF THE INVENTION

Therefore, a need has arisen for semiconductor devices and methods of manufacturing such semiconductor devices that overcome these and other shortcomings of the related art. A technical advantage of the present invention is that at least one conductive layer, e.g., the seed layer or the plate layer, or both, may comprise at least one dopant, e.g., magnesium, indium, tin, or the like. When the at least one conductive layer is annealed at a predetermined temperature, and the at least one dopant diffuses to the surface of at least one side of the at least one conductive layer and is exposed to oxygen, at least one dopant oxide layer is formed at that side of the conductive layer. For example, the at least one dopant may diffuse to the surface of the top side of the at least one conductive layer, such that the at least one dopant is exposed to oxygen. When the at least one dopant is exposed to oxygen, a dopant oxide layer having a reduced thickness and improved adhesive qualities relative to known metal or dielectric barrier layers may be formed at the surface of the top side of the at least one conductive layer. Moreover, the at least one dopant oxide layer substantially reduces or prevents the diffusion of atoms e.g., copper atoms, from one material to another material. As such, another technical advantage of the present invention is that the semiconductor device may be manufactured without a metal or dielectric barrier layer. Moreover, when an etch stop layer is formed over the at least one dopant oxide layer, because the dopant oxide layer substantially reduces or prevents the diffusion of from one material to another material, the etch stop layer does not have to substantially reduce or prevent the diffusion of atoms.

In an embodiment of the present invention, a method of manufacturing a semiconductor device is described. The method comprises the steps of providing a semiconductor substrate, forming a dielectric layer over the semiconductor substrate, and etching at least one trench or at least one via in the dielectric layer. The method also comprises the steps of forming at least one conductive layer comprising at least one dopant in the trench or the via. The method further comprises the steps of polishing the at least one conductive layer and annealing the at least one conductive layer at a predetermined temperature. Moreover, the at least one dopant diffuses substantially to the surface of at least one side of the at least one conductive layer when the at least one conductive layer is annealed at the predetermined temperature, and forms a dopant oxide layer when exposed to oxygen.

In another embodiment of the present invention, a method of manufacturing a semiconductor device is described. The method comprises the steps of providing a semiconductor substrate, forming a dielectric layer over the semiconductor substrate, and etching at least one trench or at least one via in the dielectric layer. The method also comprises the steps of forming a seed layer comprising copper in the trench or the via, and forming a plate layer comprising copper over at least a portion of the seed layer. The method further comprises the steps of polishing the plate layer and thermally annealing the seed layer or the plate layer, or both at a predetermined temperature. Moreover, the seed layer or the plate layer, or both, further comprises a dopant, and the at least one dopant diffuses substantially to the surface of at least one side of the plate layer when the seed layer or the plate layer, or both, is annealed at the predetermined temperature, and forms a dopant oxide layer when exposed to oxygen.

In yet another embodiment of the present invention, a semiconductor device is described. The semiconductor device comprises a semiconductor substrate and a dielectric layer formed over the semiconductor substrate. The semiconductor device also comprises at least one conductive layer formed in a trench or a via within the dielectric layer. The at least one conductive layer comprises at least one copper layer, and also may comprise at least one dopant oxide layer formed substantially at the surface of at least one side of the at least one conductive layer, e.g., the surface of the top side of the at least one conductive layer.

Other features and advantages will be apparent to persons of ordinary skill in the art in view of the following detailed description of the invention and the accompanying drawings.

BRIEF DESCRIPTION OF THE DRAWINGS

For a more complete understanding of the present invention, needs satisfied thereby, and the features and advantages thereof, reference now is made to the following descriptions taken in connection with the accompanying drawings.

DETAILED DESCRIPTION OF PREFERRED EMBODIMENTS

Preferred embodiments of the present invention and their advantages may be understood by referring to FIGS. 2a–2e, and 3a–b, like numerals being used for like corresponding parts in the various drawings.

Referring to FIGS. 2a–2e, and 3a, a method of manufacturing a semiconductor device according embodiments of the present invention are described. In step 302, a semiconductor substrate 202 is provided, and in step 304, a dielectric layer 204 may be formed over semiconductor substrate 202. Dielectric layer 204 may comprise any known dielectric material having a low dielectric constant, e.g., about 4.5 or less. For example, dielectric layer 204 may comprise silicon dioxide ($SiO_2$), plasma-enhanced tetraethyl orthosilicate, borophosphosilicate glass, organic silicate glass, or the like. In one embodiment, dielectric layer 204 may be formed on, and may be in direct contact with, semiconductor substrate 202 along the entire surface of semiconductor substrate 202. In step 306, at least one trench or at least one via 206, e.g., a plurality of trenches or a plurality of vias, or both, may be etched in dielectric layer 204, such that dielectric layer 204 no longer may be formed over the entire surface of semiconductor substrate 202 and a portion of the surface of semiconductor substrate 202 is exposed. Moreover, trenches or vias 206 may be etched in areas where interconnect lines or structures, e.g., copper interconnect lines or structures, may be disposed.

Figure 1A:
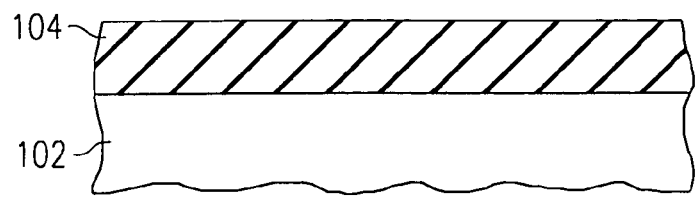
FIGS. 1a–1e are cross-sectional schematics depicting a known semiconductor device manufactured using a known method of manufacture.
Figure 1B:
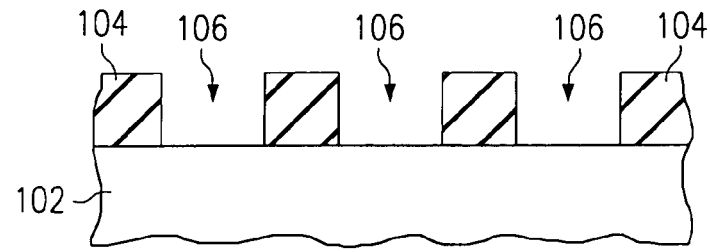
Figure 1C:
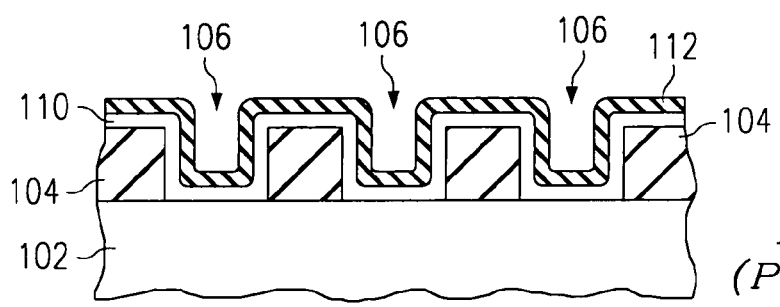
Figure 1D:
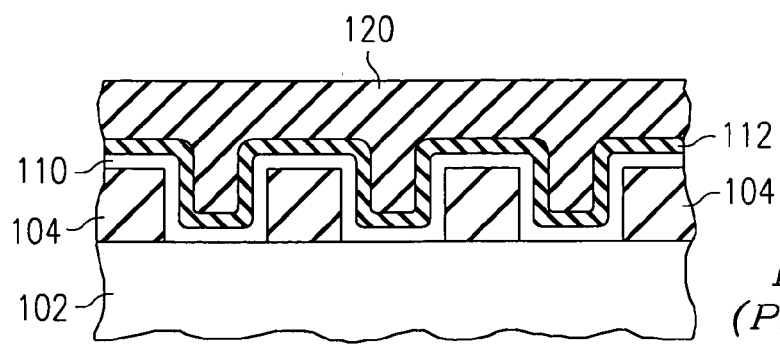
Figure 1E:
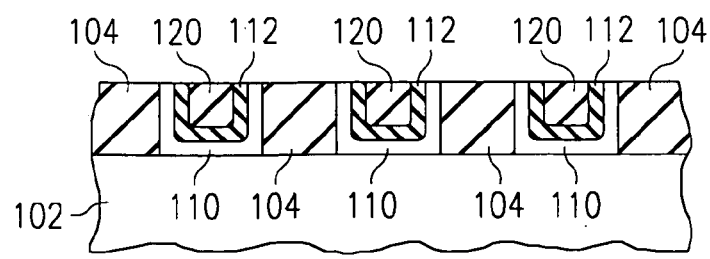
Figure 2A:
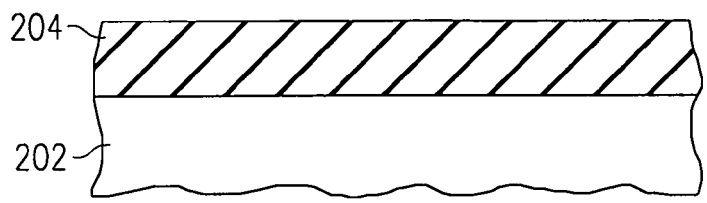
FIGS. 2a–2e are cross-sectional schematics depicting a semiconductor device, and a method of manufacturing the semiconductor device, according to an embodiment of the present invention.
Figure 2B:
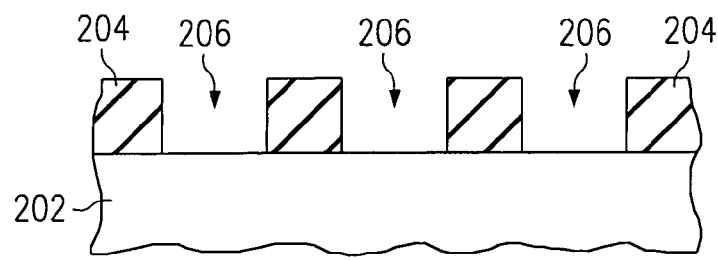
Figure 2C:
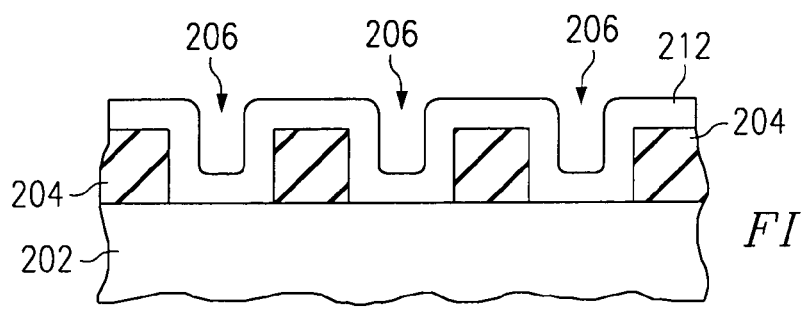
Figure 2D:
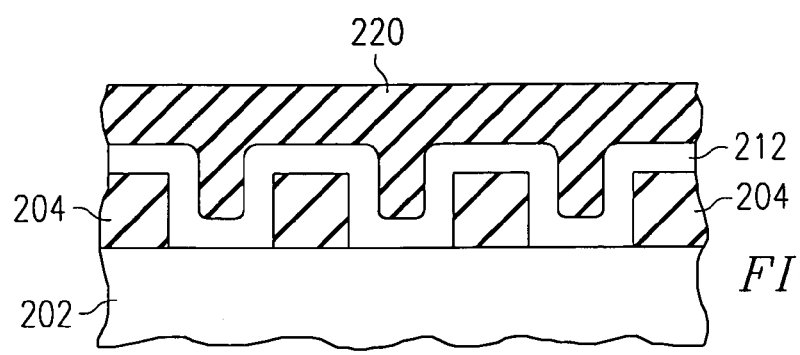
Figure 2E:
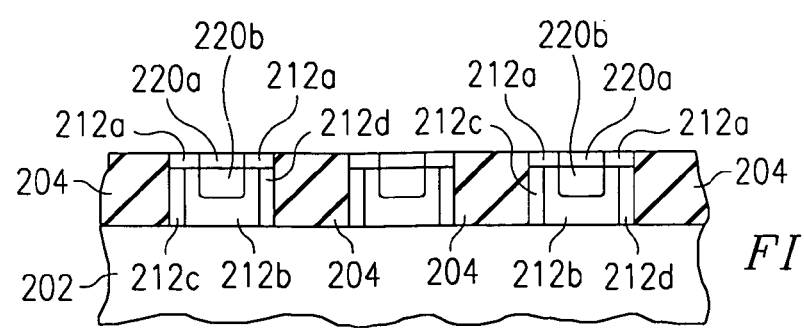
Figure 3A:
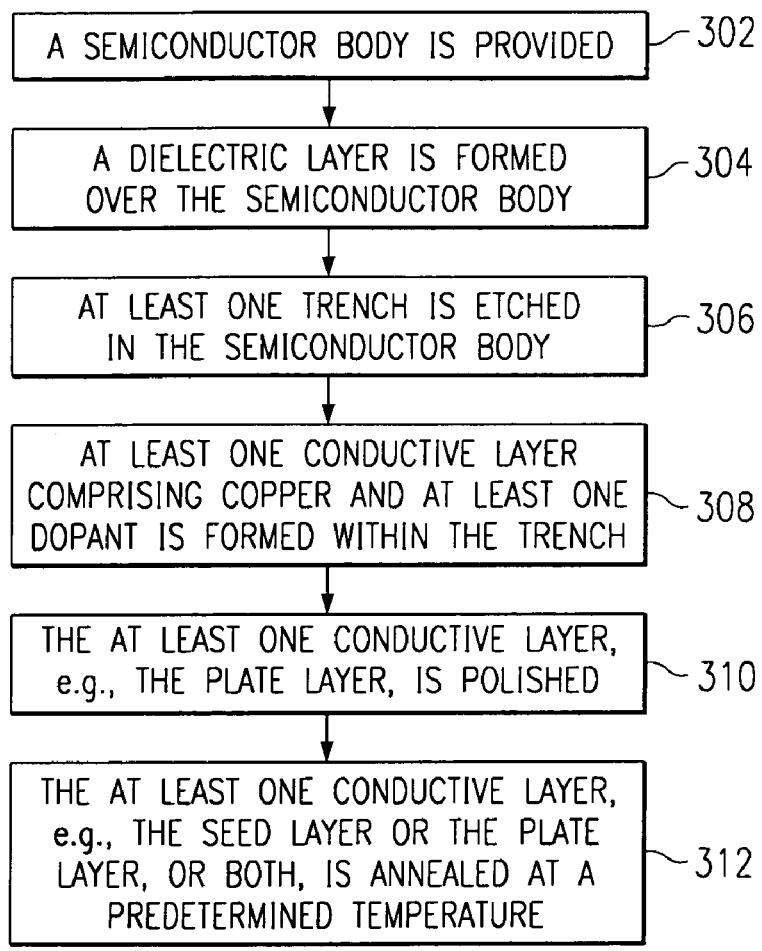
FIG. 3a is a flow chart of a method of manufacturing the semiconductor device of FIGS. 2a–2e, according to an embodiment of the present invention.
Figure 3B:
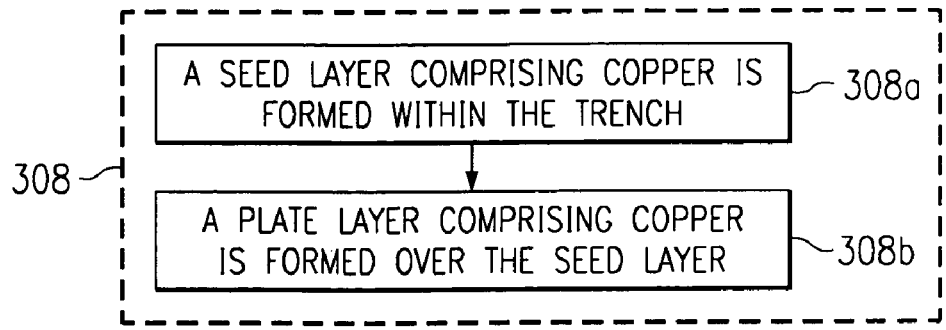
FIG. 3b is a flow chart of a method of manufacturing the semiconductor device of FIGS. 2a–2e, according to another embodiment of the present invention.

In each of the foregoing embodiments, in step 308, at least one conductive layer, e.g., a seed layer 212 or a plate layer 220, or both, may be formed within trenches or vias 206. The at least one conductive layer may comprise copper and at least one dopant, e.g., tin, magnesium, indium, or the like. For example, the at least one dopant may be added to the at least one conductive layer by any known incorporation method. The at least one dopant may be added using physical vapor deposition, chemical vapor deposition, atomic layer deposition, co-plating, or the like. Referring to FIG. 3b, step 308 may comprise steps 308a and 308b. In this embodiment, in step 308a, a seed layer 212 comprising copper may be formed over dielectric layer 204, such that at least a portion of seed layer 212 may be disposed within trenches or vias 206 and may be formed over a portion of semiconductor substrate 202. In step 308b, a plate layer 220 comprising copper may be formed over seed layer 212, such that at least a portion of plate layer 220 also may be disposed within trenches or vias 206. Moreover, in this embodiment, seed layer 212 or plate layer 220, or both, further may comprise the at least one dopant.

In each of the foregoing embodiments, in step 310, plate layer 220 may be polished, e.g., by any known chemical-mechanical polishing process. When plate layer 220 is polished, those portions of plate layer 220 formed outside trenches or vias 206 may be removed. Similarly, when plate layer 220 is polished, those portions of seed layer 212 formed outside trenches or vias 206 also may be removed, such that at least a portion of seed layer 212, at least a portion of plate layer 220, and at least a portion of dielectric layer 204 are exposed.

In step 312, the at least one conductive layer may be thermally annealed, i.e., heated and subsequently cooled in order to toughen and reduce brittleness, at a predetermined temperature. For example, the predetermined temperature may be between about 100° C. and about 400° C. Nevertheless, it will be understood by those of ordinary skill in the art that the predetermined temperature may be any temperature sufficient to diffuse a selected dopant to the surface of at least one side of the at least one conductive layer without damaging other components of the semiconductor device. Moreover, the amount of time sufficient to diffuse may depend on the temperature at which the at least one conductive layer is annealed and the chemical properties of the particular dopant. In one embodiment, the at least conductive layer is thermally annealed subsequent to the step of polishing. When the at least one conductive layer is thermally annealed at the predetermined temperature, the at least one dopant within the at least one conductive layer may diffuse substantially to the surface of at least one side of the at least one conductive layer, and may form at least one dopant oxide layer when exposed to oxygen. For example, when the at least one conductive layer comprises plate layer 220, and the at least one dopant diffuses to the surface of plate layer 220, the at least one dopant is exposed to oxygen and the at least one dopant is oxidized. As such, a dopant oxide layer 220a is formed at a first or a top side of plate layer 220, such that plate layer 220 is divided into dopant oxide layer 220a and a copper layer 220b. In another example, when the at least one conductive layer comprises seed layer 212 and the at least one dopant diffuses to the surface of seed layer 212 and is oxidized, a dopant oxide layer 212a may be formed at a first or a top side of seed layer 212. Similarly, a dopant oxide layer 212c may be formed at a second side of seed layer 212, and a dopant oxide layer 212d may be formed at a third side of seed layer 212. Specifically, dopant oxide layers 212c and 212d may be formed when the at least one dopant diffuses to the surface of the second and third sides of seed layer 212, respectively, and is exposed to oxygen contained within dielectric layer 204. As such, in one embodiment, seed layer 212 may be divided into dopant oxide layer 212a, 212c, or 212d, or a combination thereof, and a copper layer 212b. Moreover, dopant oxide layers 212a, 212c, 212d, or 220a, or a combination thereof, may substantially reduce or prevent copper atoms from diffusing from one material to another material. Further, it will be understood by those of ordinary skill in the art that a dopant oxide layer (not shown) also may be formed at a fourth or bottom side of seed layer 212, such that a dopant oxide layer contacts at least a portion of substrate 202.

In any of the foregoing embodiments, the method also may comprise the step of forming a first etch stop layer (not shown) over at least a portion of plate layer 220, such that additional levels of copper interconnect lines may be manufactured. The first etch stop layer may comprise $SiO_2$, SiN, SiC, or the like. Specifically, because the at least one dopant oxide layer already substantially reduces or prevents copper atoms from diffusing from one material to another material, the first etch stop may comprise a dielectric compound having increased stop etch qualities, irrespective of the diffusion prevention qualities of the dielectric compound, without substantially degrading the performance of the semiconductor device.

Referring again to FIGS. 2a–2e, a semiconductor device according embodiments of the present invention are described. The semiconductor device may comprise a semiconductor substrate 202 and a dielectric layer 204 formed over at least a portion of semiconductor substrate 202. Dielectric layer 204 may comprise any known dielectric material having a low dielectric constant, e.g., about 4.5 or less. For example, dielectric layer 204 may comprise silicon dioxide ($SiO_2$), plasma-enhanced tetraethyl orthosilicate, borophosphosilicate glass, or the like. The semiconductor device also may comprise at least one conductive layer formed in a trench or a via 206 within dielectric layer 204. The at least one conductive layer may comprise at least one copper layer, and also may comprise at least one dopant oxide layer, e.g., tin oxide, magnesium oxide, indium oxide, or the like. In one embodiment, the at least one conductive layer may comprise a seed layer 212. Seed layer 212 may comprise a copper layer 212b and may be formed over dielectric layer 204. The at least one conductive layer also may comprise a plate layer 220. Plate layer 220 may comprise a copper layer 220b and may be formed over seed layer 212. Moreover, seed layer 212 or plate layer 220, or both, further may comprise at least one dopant oxide layer, e.g., dopant oxide layers 212a, 212c, or 212d, or a combination thereof, and dopant oxide layer 220a, respectively.

For example, when the at least one conductive layer comprises plate layer 220, a dopant oxide layer 220a may be formed at a first or a top side of plate layer 220. As such, plate layer 220 may be divided into dopant oxide layer 220a and copper layer 220b. In another example, when the at least one conductive layer comprises seed layer 212, a dopant oxide layer 212a may be formed at a first or a top side of seed layer 212. Similarly, a dopant oxide layer 212c may be formed at a second side of seed layer 212, and a dopant oxide layer 212d may be formed at a third side of seed layer 212. As such, in one embodiment, seed layer 212 may be divided into dopant oxide layer 212a, 212c, or 212d, or a combination thereof, and copper layer 212b. Moreover, dopant oxide layers 212a, 212c, 212d, or 220a, or a combination thereof, may substantially reduce or prevent atoms, e.g., copper atoms, from diffusing from one material to another material.

In any of the foregoing embodiments, the semiconductor device also may comprise a first etch stop layer (not shown) formed over at least a portion of plate layer 220, such that additional levels of copper interconnect lines may be manufactured. The first stop etch layer may comprise $SiO_2$, SiN, SiC, or the like.

While the invention has been described in connection with preferred embodiments, it will be understood by those of ordinary skill in the art that other variations and modifications of the preferred embodiments described above may be made without departing from the scope of the invention. Other embodiments will be apparent to those of ordinary skill in the art from a consideration of the specification or practice of the invention disclosed herein.

What is claimed is:

1. A semiconductor device comprising:
   a semiconductor substrate;
   a dielectric layer formed over at least a portion of said semiconductor substrate;
   at least one conductive layer formed in a trench or a via within said dielectric layer, wherein said at least one conductive layer comprises:
   at least one copper layer containing a dopant; and
   at least one dopant oxide layer comprising indium oxide formed substantially at the open top surface and at least one dopant layer at the side surfaces of said at least one conductive layer produced when thermally annealing said at least one conductive layer at a predetermined temperature, whereby said dopant diffuses substantially to the top and side surfaces of said at least one conductive layer to form a dopant oxide layer at said top surface and said side surfaces of said at least one copper layer when said at least one conductive layer is thermally annealed at said predetermined temperature and said at least one dopant is exposed to oxygen.

2. A semiconductor device comprising:
   a semiconductor substrate;
   a dielectric layer formed over at least a portion of said semiconductor substrate;
   at least one conductive layer formed in a trench or a via within said dielectric layer, wherein said at least one conductive layer comprises:
   at least one copper layer containing a dopant; and
   at least one dopant oxide layer comprising tin oxide formed substantially at the open top surface and at least one dopant layer at the side surfaces of said at least one conductive layer produced when thermally annealing said at least one conductive layer at a predetermined temperature, whereby said dopant diffuses substantially to the top and side surfaces of said at least one conductive layer to form a dopant oxide layer at said top surface and said side surfaces of said at least one copper layer when said at least one conductive layer is thermally annealed at said predetermined temperature and said at least one dopant is exposed to oxygen.

* * * * *